United States Patent
Gatherer et al.

(10) Patent No.: US 10,554,335 B2
(45) Date of Patent: Feb. 4, 2020

(54) ADC BIT ALLOCATION UNDER BIT CONSTRAINED MU-MASSIVE MIMO SYSTEMS

(71) Applicant: Futurewei Technologies, Inc., Plano, TX (US)

(72) Inventors: Alan Gatherer, Richardson, TX (US); Jinseok Choi, Austin, TX (US)

(73) Assignee: Futurewei Technologies, Inc., Plano, TX (US)

( * ) Notice: Subject to any disclaimer, the term of this patent is extended or adjusted under 35 U.S.C. 154(b) by 54 days.

(21) Appl. No.: 15/720,743

(22) Filed: Sep. 29, 2017

(65) Prior Publication Data

US 2018/0091260 A1 Mar. 29, 2018

Related U.S. Application Data

(60) Provisional application No. 62/401,744, filed on Sep. 29, 2016.

(51) Int. Cl.
| | |
|---|---|
| *G06K 5/04* | (2006.01) |
| *H04L 1/00* | (2006.01) |
| *H03M 1/10* | (2006.01) |
| *H04W 72/04* | (2009.01) |

(52) U.S. Cl.
CPC ........ *H04L 1/0045* (2013.01); *H03M 1/1071* (2013.01); *H04L 1/0072* (2013.01); *H04W 72/0413* (2013.01)

(58) Field of Classification Search
CPC ... H04L 1/0045; H04L 1/1071; H04L 1/0072; H04L 1/007; H04L 1/20; H04L 1/1205; H04W 72/0413
See application file for complete search history.

(56) References Cited

U.S. PATENT DOCUMENTS

| | | | |
|---|---|---|---|
| 6,504,863 B1 * | 1/2003 | Hellmark | H03M 1/129 341/139 |
| 2004/0021595 A1 * | 2/2004 | Erdogan | H03H 17/0288 341/144 |
| 2013/0202054 A1 * | 8/2013 | Khan | H01Q 3/26 375/259 |
| 2016/0028454 A1 * | 1/2016 | Singh | H04B 7/0456 455/67.11 |
| 2016/0149691 A1 * | 5/2016 | Chang | H04L 5/1461 370/276 |

OTHER PUBLICATIONS

Andrew, Jeffrey G., et al., "What Will 5G Be?", *IEEE Journal on Selected Areas in Communications*, 32(6), (Jun. 2014), 1065-1082.
(Continued)

*Primary Examiner* — Samir W Rizk
(74) *Attorney, Agent, or Firm* — Schwegman Lundberg & Woessner, P.A.

(57) ABSTRACT

A method includes determining an error vector magnitude for analog signals received by multiple antennas in an array of antennas of a base station, assigning quantization bits to a plurality of analog-to-digital converters (ADCs) of the base station such that some ADCs have different numbers of quantization bits allocated from a fixed total number of available quantization bits of the base station, and applying the analog signals to the ADCs with quantization bits assigned to reduce the error vector magnitude of the analog signals.

22 Claims, 10 Drawing Sheets

(56) References Cited

OTHER PUBLICATIONS

Heath Jr., Robert W., et al., "An Overview of Signal Processing Techniques for Millimeter Wave MIMO Systems", *IEEE Journal of Selected Topics in Signal Processing*, 10(3), (Apr. 2016), 436-453.
Pi, Zhouyue, et al., "An Introduction to Millimeter-Wave Mobile Broadband Systems", *IEEE Communications Magazine*, (Jun. 2011), 101-107.
Swindlehurts, A. Lee, et al., "Millimeter-Wave Massive MIMO: The Next Wireless Revolution?", *IEEE Communications Magazine*, (Sep. 2014), 56-62.

\* cited by examiner

US 10,554,335 B2

ADC BIT ALLOCATION UNDER BIT CONSTRAINED MU-MASSIVE MIMO SYSTEMS

CLAIM OF PRIORITY

This application claims the benefit of priority under 35 U.S.C. § 119(e) of U.S. Provisional Patent Application Ser. No. 62/401,744, filed on Sep. 29, 2016, which is herein incorporated by reference in its entirety.

FIELD OF THE INVENTION

The present disclosure is related to multiple input multiple output (MIMO) systems, and in particular to quantization bit allocation to multiple analog-to-digital converters (ADCs) in a bit constrained millimeter wave (mmWave) massive multiple user (MU) massive MIMO communication system.

BACKGROUND

A mmWave communication system has been regarded as a promising technology for the next generation of cellular systems. To compensate the large pathloss exponent of mmWave channels, a high beamforming gain is used. For the sake of the small wavelength of mmWaves, large antenna arrays can be implemented with a small antenna spacing and potentially lead to orders of magnitude increases in data rate for wireless communications. One of the inevitable limitations of such large antenna arrays, however, is significant hardware power consumption due to the large number of antenna outputs.

SUMMARY

A method includes determining an error vector magnitude for analog signals received by multiple antennas in an array of antennas of a base station, assigning quantization bits to a plurality of analog-to-digital converters (ADCs) of the base station such that some ADCs have different numbers of quantization bits allocated from a fixed total number of available quantization bits of the base station, and applying the analog signals to the ADCs with quantization bits assigned to reduce the error vector magnitude of the analog signals.

In one embodiment, a base station includes an array of beamforming antennas that receive signals with varying signal-to-noise ratio (SNR). A plurality of analog-to-digital converters (ADCs) have different numbers of quantization bits. The ADCs are coupled to the antennas such that error vector magnitude is reduced for a fixed total number of quantization bits of the base station. In a further embodiment, a base station includes a processor and a storage device coupled to the processor to cause the processor to execute operations. The operations include determining a SNR for analog signals received by multiple antennas in an array of antennas of a base station, providing the analog signals to a plurality of analog-to-digital converters (ADCs) of the base station having different numbers of quantization bits allocated from a fixed total number of available quantization bits of the base station, wherein the quantization bits are allocated to the ADCs such that error vector magnitude of the analog signals is reduced, and converting the analog signals to digital signals via the ADCs.

DETAILED DESCRIPTION

Figure 1A:
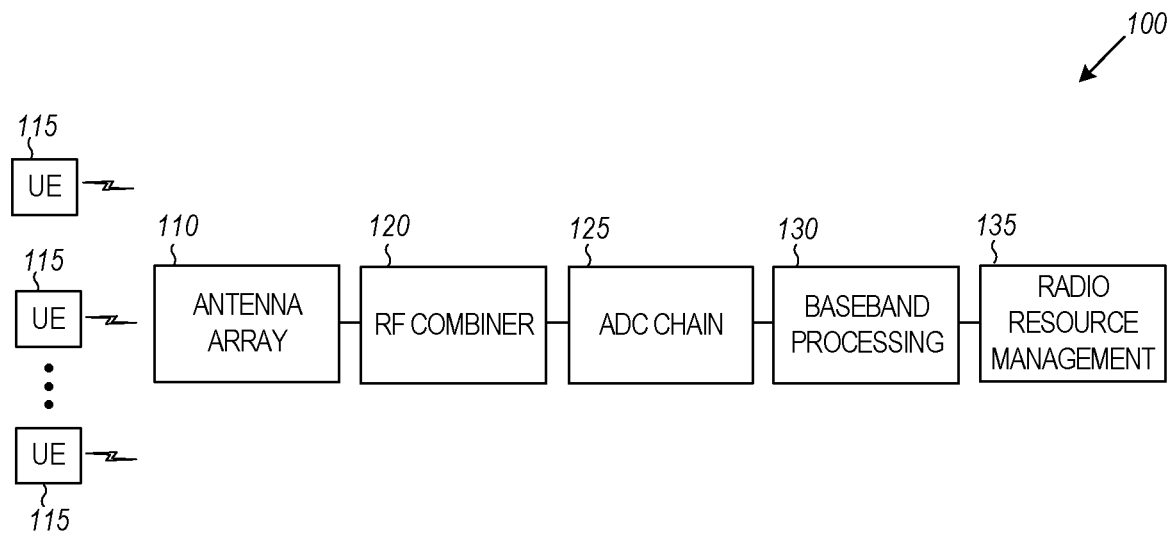
FIG. 1A is a block diagram illustrating an example base station 100 having an array of a number of antennas used for receiving signals according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

A millimeter wave (mmWave) communication system has been regarded as a promising technology for the next generation of cellular systems. To compensate for the large pathloss exponent of mmWave channels, a high beamforming gain is used. For the sake of the small wavelength of mmWaves, large antenna arrays can be implemented with a small antenna spacing and potentially lead to orders of magnitude increases in data rate for wireless communications.

One of the inevitable limitations of such large antenna arrays, however, is significant hardware power consumption due to the large number of antenna outputs accompanying excessive analog-to-digital front-end bit-rate with the large signal bandwidth. Thereby, it is desired to reduce the hardware power consumption with minimal performance degradation to realize the mmWave communications for a future generation wireless communication.

In various embodiments, an analog RF chain may be sampled with variable resolution by providing analog to digital converters with different numbers of quantization bits. An analog beamformer may be used to preprocess a received signal to project the signals onto the beamspace by shifting phases. The number of quantization bits available to a base station may be limited due to system resource constraints, such as memory and processing capabilities. In certain embodiments, the analog to digital converters following the beamformer have different fixed numbers of quantization bits. Each analog-to-digital converter (ADC) pair can be connected to any preprocessed output. Each ADC pair may have a different number of quantization bits which is from 0 to bmax, where a 0-bit ADC means that the corresponding RF chain is not in use. The number of quantization bits is fixed for an ADC and an ADC is matched to a received signal by the number of quantization bits. In certain embodiments, each ADC has a variable number of quantization bits, and different numbers of bits are enabled for different pairs of ADCs based on the signals they receive.

FIG. 1A is a block diagram illustrating an example base station 100 having an array of N antennas 110 used for receiving signals. Base station (BS) 100 in one embodiment is a multiple-input multiple-output (MIMO) communication system. M user equipment (UE) indicated at 115 each may use a single antenna to transmit signals to the base station 100 equipped with N antennas 110 (N>>M) through narrowband channels, where M and N are integers. BS may include cells or evolved NodeBs (eNB) (also commonly referred to as NodeBs, base terminal stations, communications controllers, network controllers, controllers, access points (APs)). UE may include cell phones, mobile stations, users, subscribers, terminals and other devices that may wireless communicate with a base station.

In one embodiment, the channels may be mmWave channels. Other wavelengths may be used in further embodiments. The channels are sparse in beamspace. Each antenna at the BS 100 is connected to an RF chain which combines RF signals at an RF combiner 120 and converts analog signals to digital signals through one pair of multiple pairs of analog-to-digital converters (ADCs) 125; one each for real and imaginary components of the signals. In further embodiments, the signals from each antenna may be coupled directly to the ADCs 125 without the use of an RF combiner 120.

In further embodiments, the ADCs might sample the baseband (and therefore real and imaginary analog streams) or may sample the passband at some low IF (intermediate frequency), and therefore will sample only a single low IF signal, after which the signal is down converted.

The digital signals are provided to a baseband processing unit 130, which is configured as a network interface that manages all radio functions, such as functions that use the antennas. The baseband processing unit 130 may have its own processor and memory used to manage the radio functions. A radio resource management (RRM) unit 135 may provide for management of user radio resources, such as user allocation, beamforming, data rates, handover criteria, modulation scheme, error coding scheme and other functions related to managing radio resources for user equipment.

In one embodiment, the ADCs with the highest number of quantization bits are coupled to receive signals with the highest channel gain. The use of a larger number of quantization bits for higher gain signals provides for a more accurate or more granular digital representation of the analog signal. If one bit is used (i.e., a one-bit ADC), only two digital representations of the analog signal are available. If two quantization bits are used, four digital representations provide a more granular representation. Three bits or more provide significantly more resolution, resulting in a more accurate digital representation of the analog signal at each sample time. Coupling the receive signals in this manner provides an optimized bit resolution to most efficiently use system resources available.

The coupling may be determined at installation of BS 100, and may be a function of an average channel gain measured during installation. The ADCs may also have their number of quantization bits determined during operation. The number of bits per ADC may add up to the number of bits supportable by available system resources and may be distributed in any manner desired, such as an equal number of ADCs with 1, 2, 3, and 4 bits, or more, limited by the number of bits available. In further embodiments, the number of bits may be varied to match the distribution of antennas with different channel gains, such that if there are relatively few antennas with a high gain, there will be a corresponding relatively view ADCs with a larger number of quantization bits.

Figure 1B:
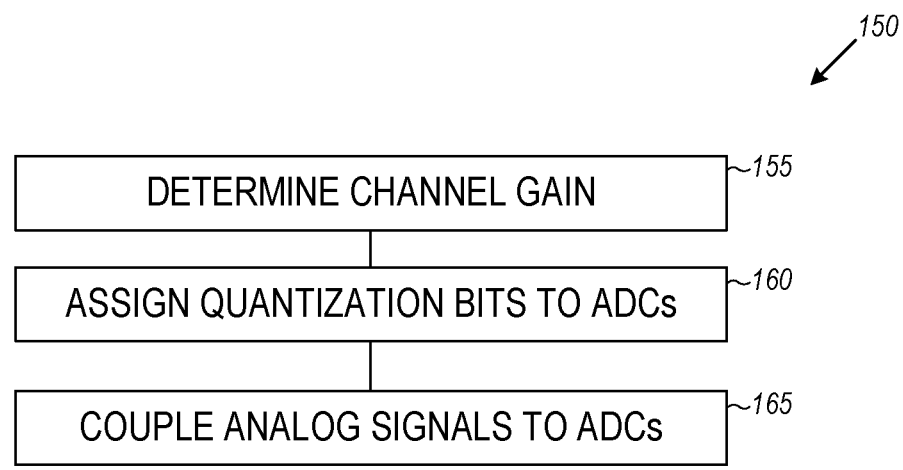
FIG. 1B is a flowchart illustrating a method of assigning quantization bits to ADCs according to an example embodiment.

FIG. 1B is a flowchart illustrating a method 150 of assigning quantization bits to ADCs. At 155, a channel gain is determined for analog signals received by multiple antennas in an array of antennas of a base station. Channel gain may be determined using channel state information. In some embodiments, a complex channel is determined using the channel state information. At 160, quantization bits are assigned to a plurality of analog-to-digital converters (ADCs) of the base station such that some ADCs have different numbers of fixed quantization bits. At 165, the analog signals are coupled to the ADCs such that higher gain signals are provided to ADCs having a higher number of quantization bits. This can be done by setting the number of bits in the variable-bit ADCs coupled to the analog signals, or by matching the analog signal to the appropriate fixed-bit ADC, such as by matching by signal gain.

Figure 2A:
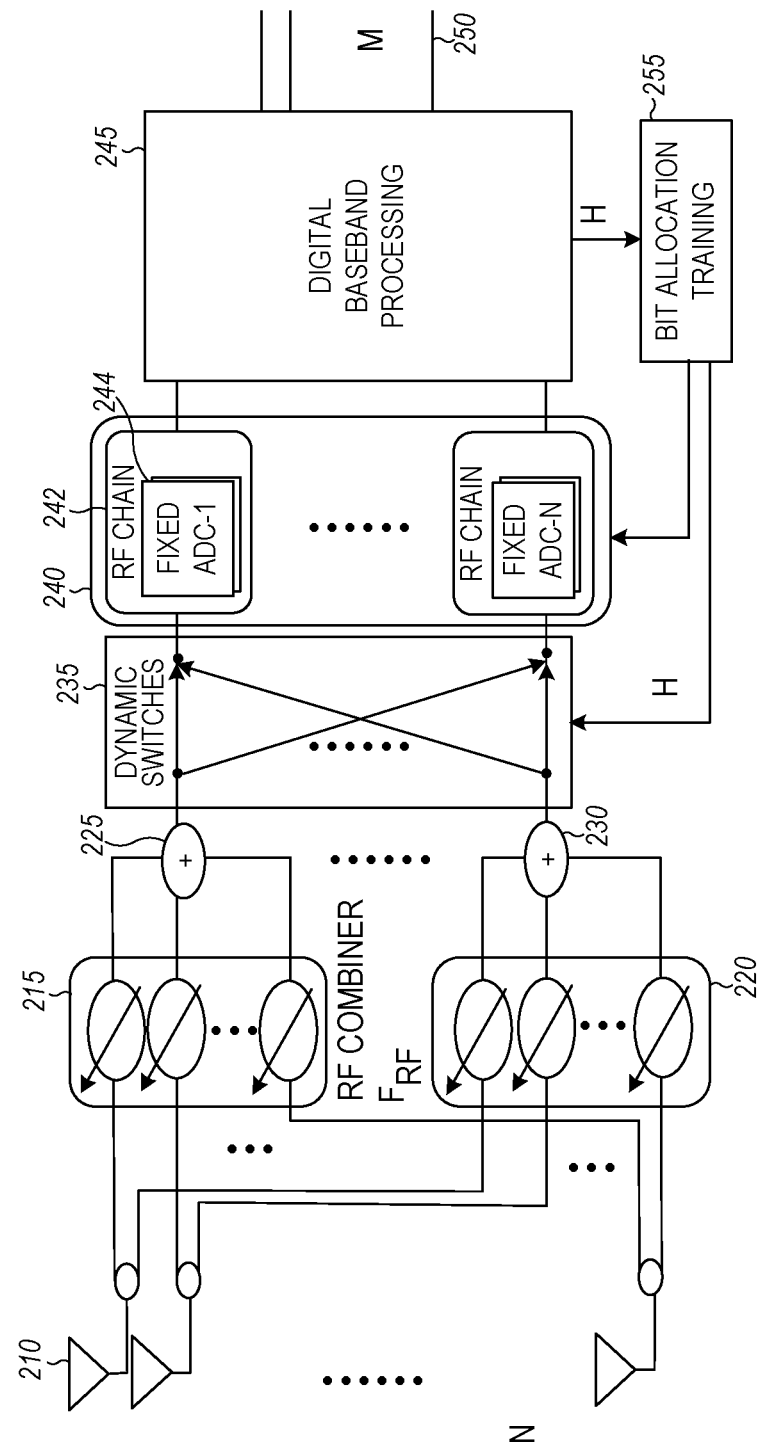
FIG. 2A is a block diagram of a system for matching analog signals to ADCs having different numbers of quantization bits according to an example embodiment.

FIG. 2A is a block diagram of another embodiment of a system for matching analog signals to ADCs having different numbers of quantization bits. An array of N antennas 210 are coupled to an RF combiner 215 and 220 corresponding to real and imaginary components of signals received by the antennas 210. The real components are combined as indicated at 225, and the imaginary components are combined as indicated at 230 and provided via a set of dynamic switches 235 to a bank of ADCs 240. ADCs 240 include a number of RF chains 242, each having a pair of ADCs 244 to convert the real and imaginary analog signals to digital signals, which are provided to a digital baseband processing unit 245 for communication with M UEs 250.

Digital baseband processing unit 245 may be configured as a network interface that manages all radio functions, such as functions that use the antennas. The digital baseband processing unit 245 may have its own processor and memory used to manage the radio functions. In one embodiment, digital baseband processing unit 245 maintains channel state information, H, a measure of the state of each channel, and may represent the combined effect of, for example, scattering, fading, and power decay with distance.

A bit allocation training unit 255 may receive the channel state information, H, from the digital baseband processing unit 245 and use the information to determine the allocation of quantization bits for each ADC 240 as well as to control the dynamic switch 235 to couple the signals to a suitable ADC 240.

In one embodiment, an analog beamformer preprocesses received signals to project the signals onto the beamspace by shifting phases, and each following ADC pair can be connected to any preprocessed output using dynamic switches. Each ADC pair may have a different number of quantization bits which is from 0 to $b_{max}$, where a 0-bit ADC means that the corresponding RF chain is not in use, and the number of quantization bits is fixed for all ADCs. The channel having the signal with the ith largest gain may be coupled to the ADC with the ith largest number of bits based on the channel state information H.

Figure 2B:
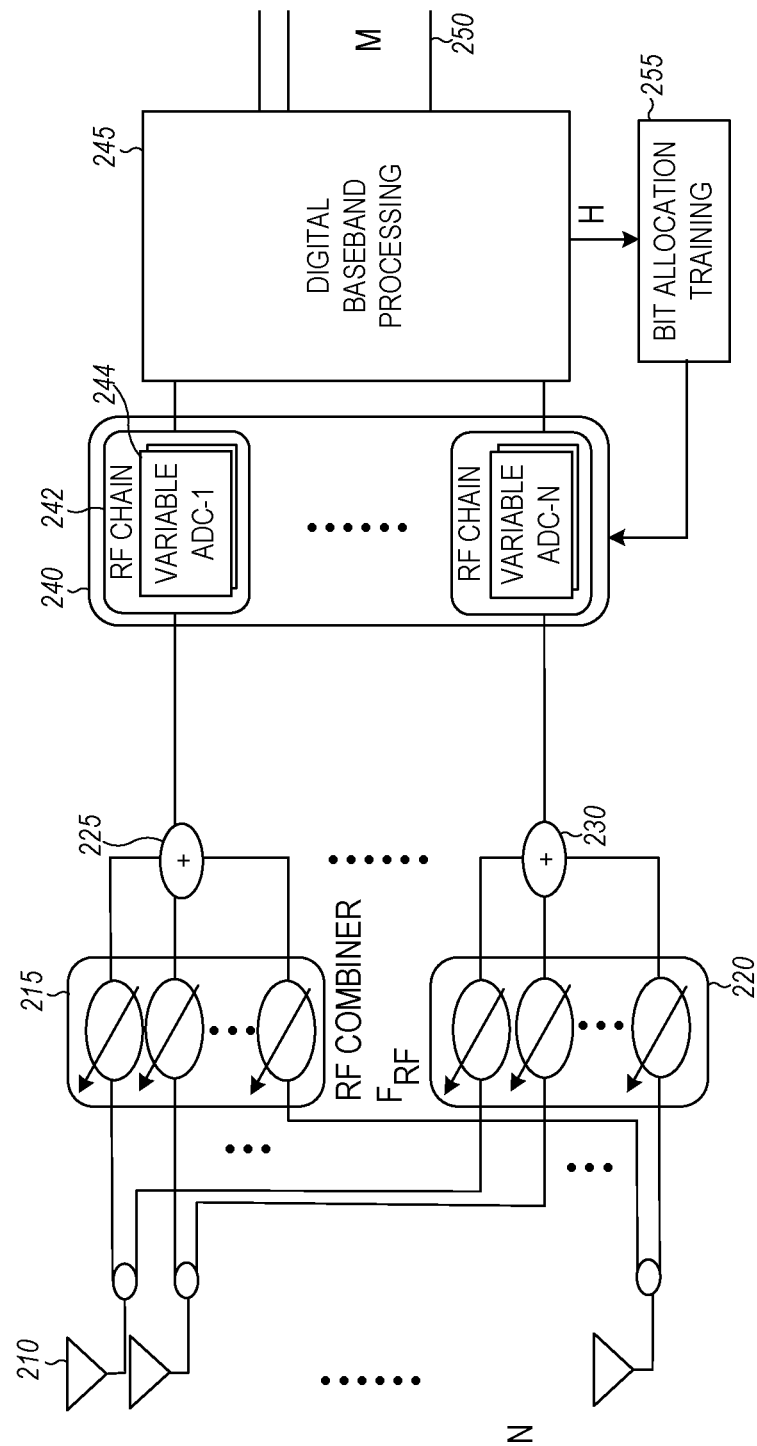
FIG. 2B is a block diagram of another system for matching analog signals to ADCs having different numbers of quantization bits according to an example embodiment.

FIG. 2B is a block diagram of another embodiment of the system. In this approach, the outputs of the RF combiners are provided to dedicated ADCs 244 that are variable bit ADCs. For example, each of the ADCs may be configurable to be any of a 0-bit ADC to a $b_{max}$-bit ADC. The ADC of the channel having the signal with the ith largest gain may be configured with the ith largest number of bits based on the channel information H, or a different configuration may be used.

Given total bit constraint, optimizing the fixed bit resolutions for the ADCs can achieve much improved performance compared to a uniform allocation of ADC bits while consuming the same power. In one embodiment the dynamic switch 235 may be used to couple the signals to selected ADCs based on H.

Figure 3:
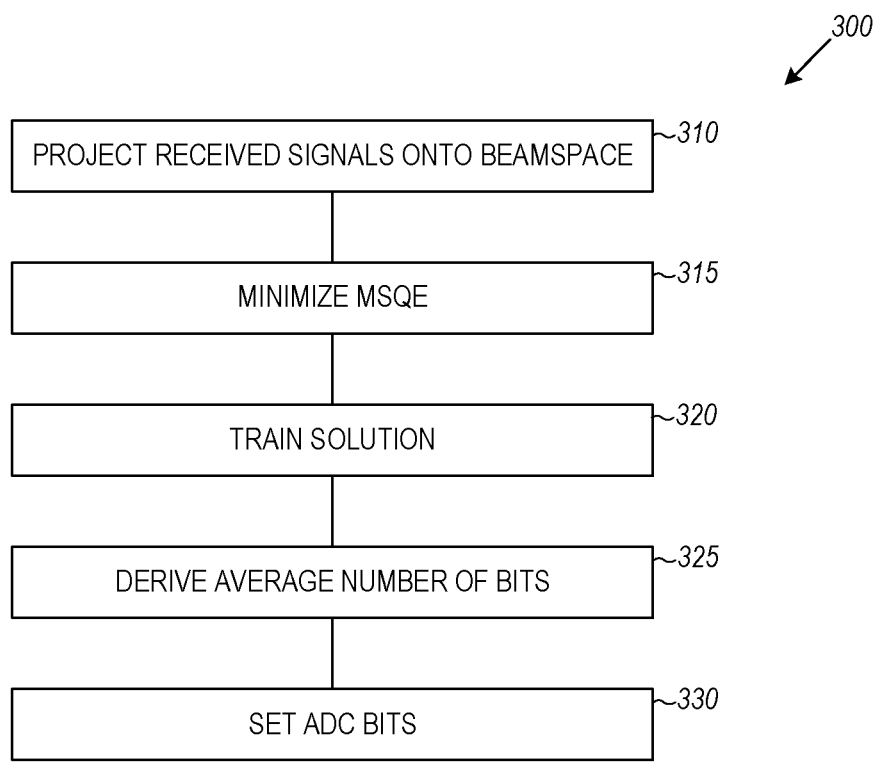
FIG. 3 is a flowchart illustrating a method that may be performed by a bit allocation training unit to optimize the bit resolutions for each ADC according to an example embodiment.

FIG. 3 is a flowchart illustrating a method 300 that may be performed by the bit allocation training unit 255 to optimize the bit resolutions for each ADC. At 310, an analog beamformer which equals the antenna array response is used to project received signals onto the beamspace. At 315, a mean square quantization error (MSQE) minimization may be performed to find the optimal bit allocation for the ADCs. This can be performed by using a greedy algorithm which increases quantization bit for the largest MSQE until it uses the total bits. One implementation of a greedy algorithm is described below.

At 320, a solution is trained to find the long-term statistic solution, i.e., for a certain communication environment, solutions are collected to find the distribution of the number of ADCs with respect to quantization bits $b \in \{0, \ldots, b_{max}\}$. At 325, the average numbers for each b bits per ADC are derived. The average number of b bits per ADC is used to determine the number of the ADCs. Thus, the training process gives the near optimal bit distribution of the ADC set for a certain communication environment. The base station may then set the ADCs with the corresponding bits at 330.

Figure 4A:
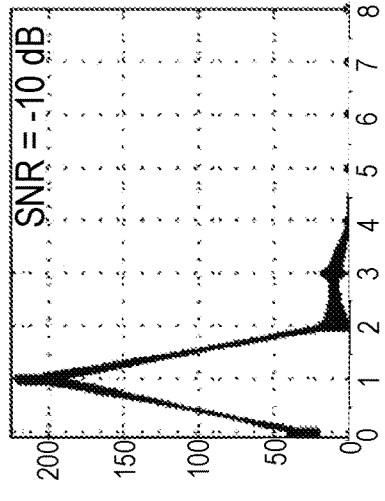
FIGS. 4A, 4B, 4C, 4D, 4E, and 4F are graphs illustrating an example distribution of ADCs with respect to quantization bits for different signal-to-noise ratios (SNRs) according to an example embodiment.
Figure 4B:
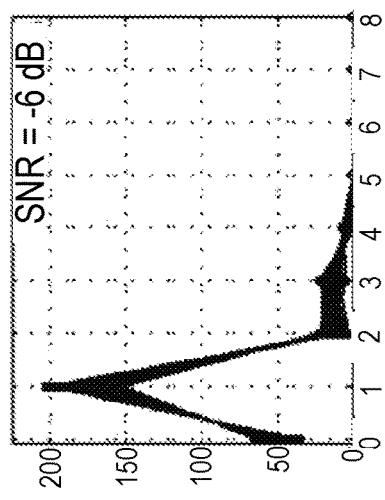
Figure 4C:
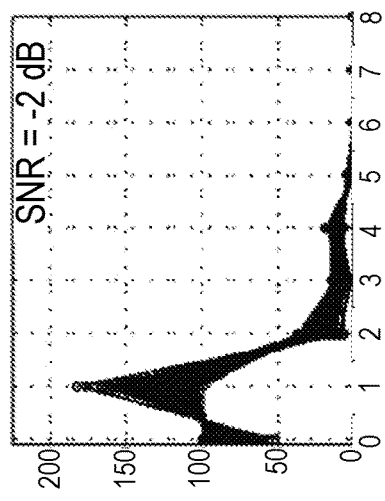
Figure 4D:
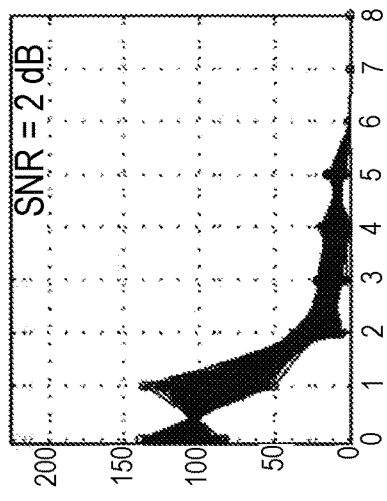
Figure 4E:
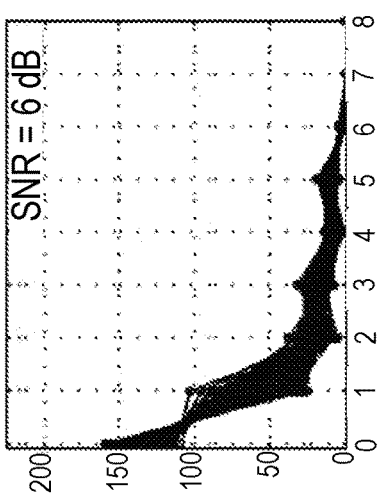
Figure 4F:
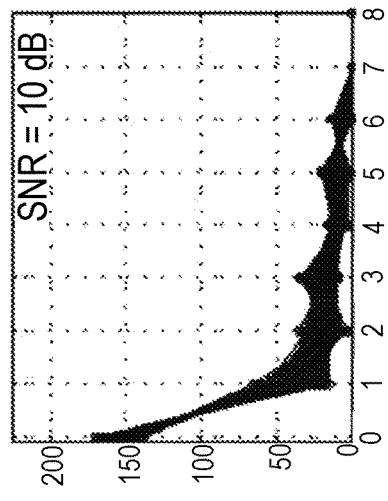

FIGS. 4A, 4B, 4C, 4D, 4E, and 4F are graphs illustrating an example distribution of 256 ADCs with respect to quantization bits for different signal-to-noise ratios (SNRs). FIGS. 4A-4F illustrate ADC quantization bits on the x-axis, with the y-axis representing the number of ADCs having the corresponding number of quantization bits. The SNRs for the respective FIGS. 4A-4F are −10 dB, −6 dB, −2 dB, 2 dB, 6 dB, and 10 dB. In FIG. 4A, the largest number of ADCs are fixed with 1 quantization bit, with a few at 0, 2, 3, and 4. As the SNRs increase, the curve gradually shifts to the right, with more and more ADCs having more than 2 quantization bits, and a few having six or more quantization bits by the time the SNR reaches 10 dB in FIG. 4F.

Figure 5:
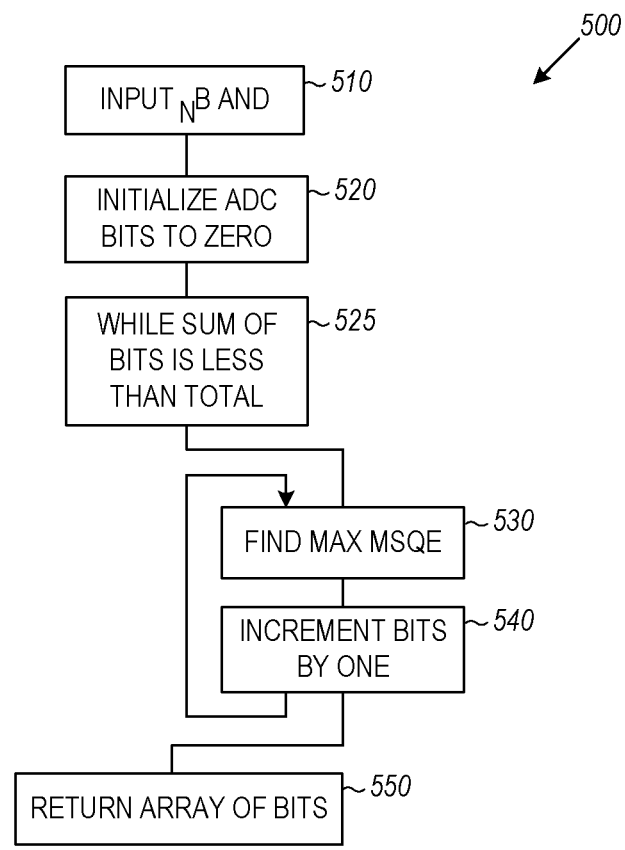
FIG. 5 is a flowchart illustrating a greedy bit allocation (GBA) method according to an example embodiment.

FIG. 5 is a flowchart illustrating a greedy bit allocation (GBA) method 500. Method 500 may be described with reference to corresponding pseudocode as follows.

```
1: Input B,N
2: Initialize b = [b_1,b_2,...,b_K]^T = 0
3: while Σ_{i=1}^N b_i < B do
4:    Find b_{i*} = argmax_{b=[b_1,b_2,...,b_N]^T} MSQE_i(b_i)
5:    b_{i*} = b_{i*} + 1
6: end while
7: Return b
```

The pseudocode representation of GBA method 500 including receiving at 510 an input of B, the total number of quantization bits supported by the BS, and N, the number of antennas and ADCs. Arrays of b, the number of quantization bits corresponding to the ADCs, is then initialized to zero at 520. While the sum of bits for an ith ADC is less than the total number of bits available as represented at 525, a maximum MSQE for the current number of bits for the ADC is found at 530, and the number of bits for the ith ADC is incremented by 1 at 540. Method 500 ends when i reaches N, or $b_i$ is not less than B, and b is returned at 550.

Figure 6:
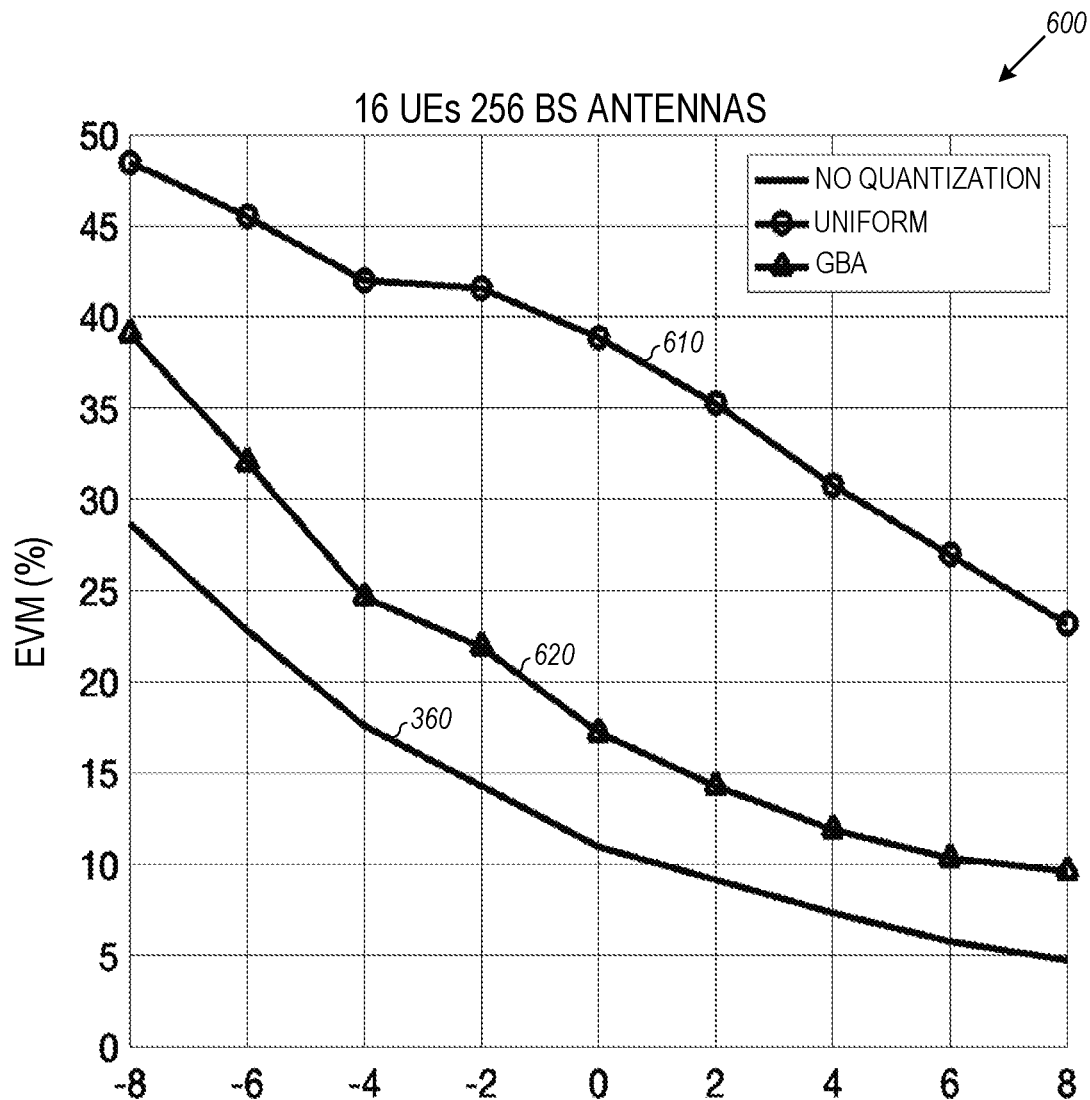
FIG. 6 is an error vector magnitude (EVM) graph showing lines generated via a simulation for uniform ADC, the greedy bit allocation (GBA) and non-quantization cases according to an example embodiment.

FIG. 6 is an error vector magnitude (EVM) graph 600 showing lines generated via a simulation for uniform ADC at 610, the greedy bit allocation (GBA) at 620 and non-quantization cases at 630. The uniform ADC 610 consumes the same power as the corresponding GBA 620 at each signal-to-ratio (SNR). EVM is a conventional measure of modulation quality and error performance in a complex wireless system. EVM is one way to evaluate performance of the wireless system. An extreme case of total bit constraint is given for GBA 620, which is 512 bits (1 bit per ADC on average). Note that the uniform case is designed to consume the same power as GBA, i.e., it is not necessarily 1 bit ADCs; it turns out to be the combination of 1 bit ADCs and 2 bit ADCs in the simulation. Consequently, the GBA method achieves much less EVM than the uniform ADC case consuming the same power as observed. Also, if the combination includes zero-bits ADCs (i.e., the RF chain is turned off), less power may be power consumed. Moreover, if the resolutions of the ADCs are fixed for each SNR, the resolutions do not need to be changed at each process.

Other algorithms to determine the number of bits for an ADC can be used. In some embodiments, the number of bits for ith ADC ($\hat{b}_i$) can be determined as $$\hat{b}_i = \bar{b} + \log_2\left(\frac{N_{RF}(1+SNR_i^{rf})^{\frac{1}{3}}}{\sum_{j=1}^{N_{RF}}(1+SNR_j^{rf})^{\frac{1}{3}}}\right), i = 1, \ldots, N_{RF}$$

where $N_{RF}$ is the number of RF chains after the analog beamfinder, $\bar{b}$ is the average number of bits per ADC, and $SNR_i^{rf}$ is $$SNR_i^{rf} = p_u \|H_i\|^2,$$

where $p_u$ is the average transmit power of users and $H_i$ represents the $N_r \times N_u$ channel matrix between a number ($N_u$) of users and a base station having a number ($N_r$) of antennas.

This algorithm determines the optimal number of quantization bits as the number of bits that minimizes or reduces the total MSQE, or MMSQE.

The MMSQE bit allocation algorithm (MMSQE-BA) is dependent to the additive noise and is not solely to minimize the desired signal. A revised MMSQE-BA algorithm (revMMSQE-BA) minimizes the quantization error of only the desired signal and ignores the additive noise.

Figure 7A:
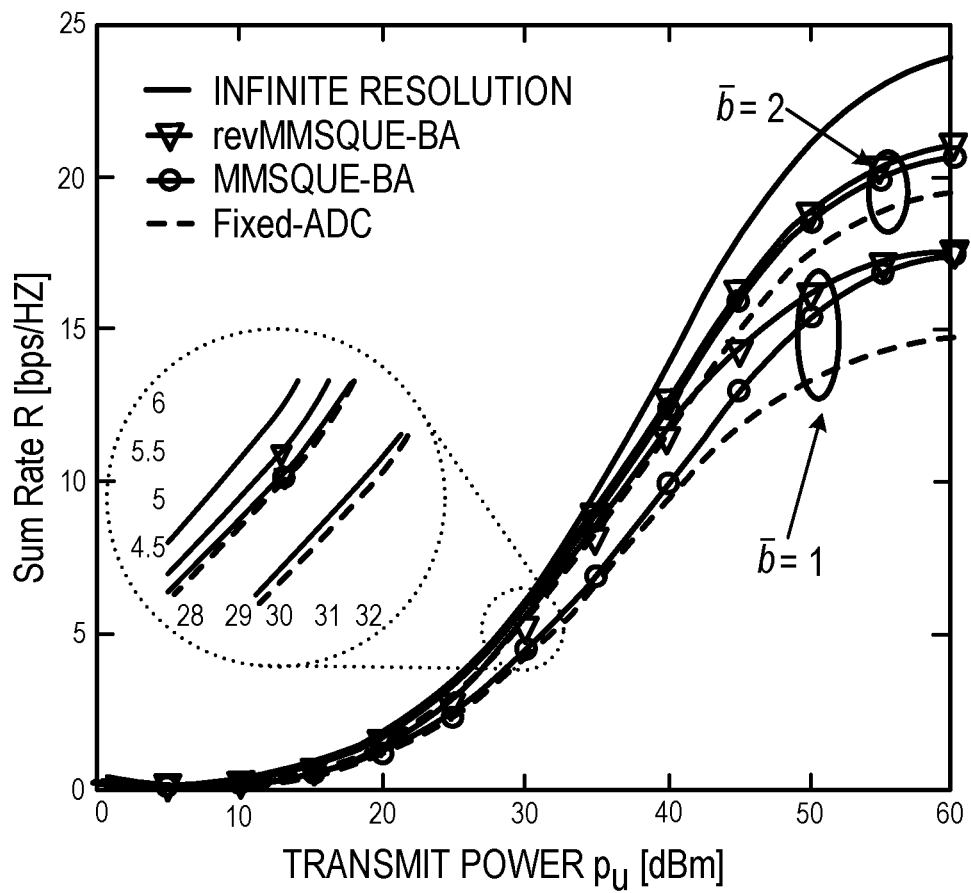
FIGS. 7A and 7B are uplink sum rate graphs showing lines generated via simulation for reduced mean square quantization error (MMSQE) according to example embodiments.

FIG. 7A is a graph of simulation results of uplink sum rate R versus transmit power $p_u$ for $\bar{b} \in \{1, 2\}$ constraint bits, $N_u=8$ users and $N_r=256$ base station antennas. The uplink sum rate R is a measure of performance defined as $$R = \Sigma_{n=1}^{N_u} R_n$$

where $R_n$ is the ergodic rate of user n. The graph compares the performance of the MMSQE-BA and the revMMSQE-BA algorithms to the ideal result obtained infinite bit resolution and to the fixed ADC case. The results are shown for $\bar{b}=1$ and $\bar{b}=2$. The results show that the revMMSQE-BA algorithm achieves the best channel capacity in terms of sum rate over the entire range of transmit power, while the MMSQE-BA algorithm shows similar performance to the fixed ADC case in the lower range due to additive noise.

Figure 7B:
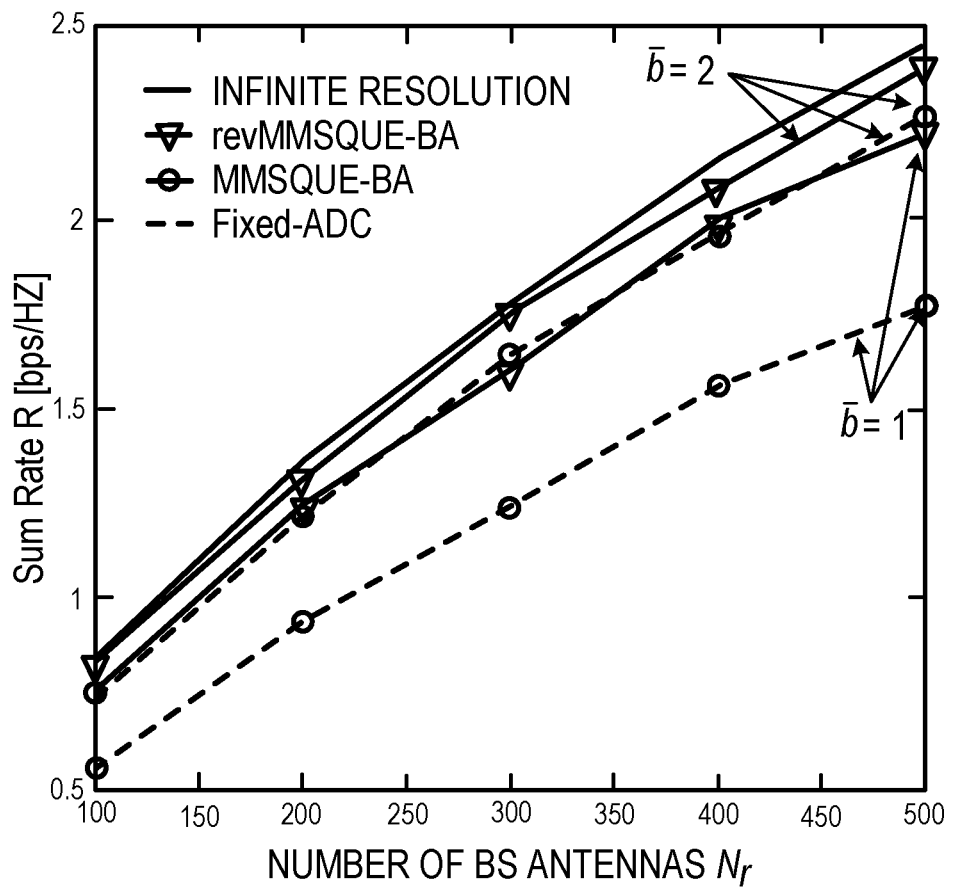

FIG. 7B is a graph of simulation results of uplink sum rate versus the number $N_r$ of base station antennas for an average transmit power $p_u=20$ decibel meters (dBm). As in FIG. 7A, the performance of fixed ADC, MMSQE-BA, and revMMSQE-BA is compared to the ideal result obtained infinite bit resolution. The results show that the revMMSQE-BA algorithm again achieves the best channel capacity in terms of sum rate over the entire range of $N_r$. The graphs in FIGS. 7A and 7B also show that the bit allocation has a greater impact on performance when the sum rate is in the double digits.

Figure 8:
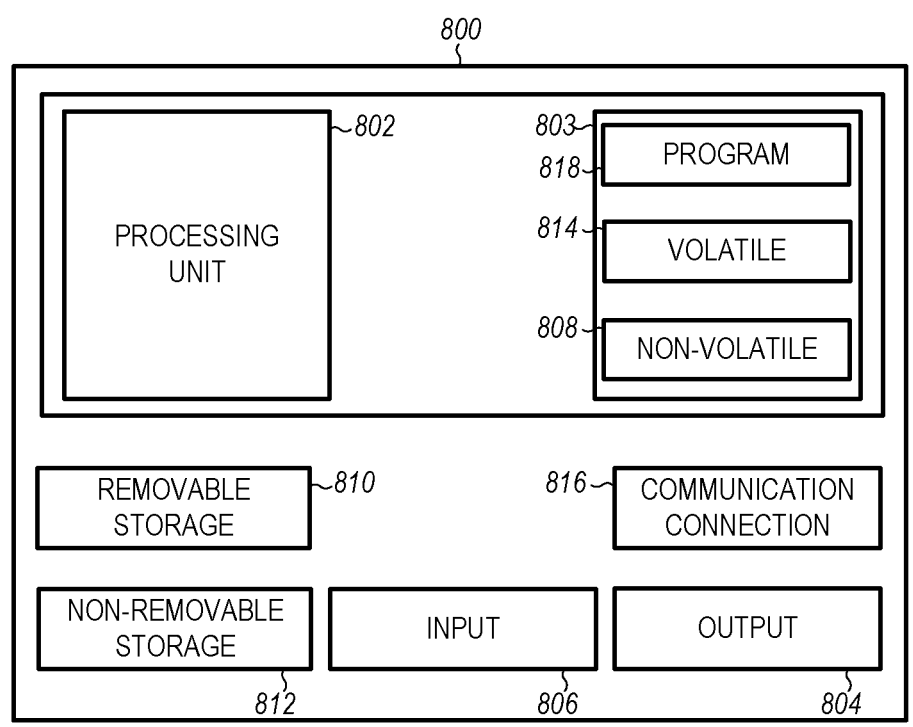
FIG. 8 is a block diagram illustrating circuitry for base station (BS), user equipment (UE) units or other devices, and may be used to perform functions and methods according to example embodiments.

FIG. 8 is a block diagram illustrating circuitry for BS, UE, units or other devices, and may be used to perform functions and methods according to example embodiments. All components need not be used in various embodiments. For example, UE and BS may each use a different set of components.

One example computing device in the form of a computer 800 may include a processing unit 802, memory 803, removable storage 810, and non-removable storage 812. Although the example computing device is illustrated and described as computer 800, the computing device may be in different forms in different embodiments. For example, the computing device may instead be a smartphone, a tablet, smartwatch, or other computing device including the same or similar elements as illustrated and described with regard to FIG. 8. Devices, such as smartphones, tablets, and smartwatches, are generally collectively referred to as mobile devices or user equipment. Further, although the various data storage elements are illustrated as part of the computer 800, the storage may also or alternatively include cloud-based storage accessible via a network, such as the Internet or server based storage.

Memory 803 may include volatile memory 814 and non-volatile memory 808. Computer 800 may include—or have access to a computing environment that includes—a variety of computer-readable media, such as volatile memory 814 and non-volatile memory 808, removable storage 810 and non-removable storage 812. Computer storage includes random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

Computer 800 may include or have access to a computing environment that includes input 806, output 804, and a communication connection or interface 816. Output 804 may include a display device, such as a touchscreen, that also may serve as an input device. The input 806 may include one or more of a touchscreen, touchpad, mouse, keyboard, camera, one or more device-specific buttons, one or more sensors integrated within or coupled via wired or wireless data connections to the computer 800, and other input devices. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN), cellular, WiFi, Bluetooth, or other networks.

Computer-readable instructions stored on a computer-readable medium are executable by the processing unit 802 of the computer 800. A hard drive, CD-ROM, and RAM are some examples of articles including a non-transitory computer-readable medium such as a storage device. The terms computer-readable medium and storage device do not include carrier waves to the extent carrier waves are deemed too transitory. For example, a computer program 818 may be used to cause processing unit 802 to perform one or more methods or algorithms described herein.

EXAMPLES

In example 1, a method comprises determining an error vector magnitude for analog signals received by multiple antennas in an array of antennas of a base station, assigning quantization bits to a plurality of analog-to-digital converters (ADCs) of the base station such that some ADCs have different numbers of quantization bits allocated from a fixed total number of available quantization bits of the base station, and applying the analog signals to the ADCs with quantization bits assigned to reduce the error vector magnitude of the analog signals.

Example 2 includes the method of example 1 wherein the array of antennas comprise an array of N millimeter (MM) wave beamforming antennas and wherein the ADCs comprise N ADCs.

Example 3 includes the method of example 1 and further comprising determining channel gain for the analog signals; and assigning quantization bits to ADCs as a function of the determined channel gains such that higher gain signals are provided to ADCs having a higher number of quantization bits.

Example 4 includes the method of example 3 wherein the channel gain corresponds to channel state information H.

Example 5 includes the method of example 1 wherein a mean square quantization error (MSQE) minimization problem is solved to find optimal bit allocation for the ADCs.

Example 6 includes the method of example 5 wherein a greedy bit allocation algorithm is performed to increase quantization bits for the largest MSQE until a total number available bits is used.

Example 7 includes the method of example 6 wherein a fixed number of quantization bits for each ADC is derived as a function of an average of multiple greedy bit allocation algorithm performances over time for that ADC for a given communication environment.

Example 8 includes the method of example 1 wherein a dynamic switch is used to dynamically couple the analog signals to the ADCs to minimize error vector magnitude.

Example 9 includes the method of example 8 wherein an RF combiner is used to combine the signals comprising real and imaginary components of the signals from the antennas, such that the dynamic switch provides the components to corresponding pairs of ADCs.

Example 10 includes the method of example 9 wherein the corresponding pairs of ADCs provide digital signals representative of the real and imaginary components of the signals from the antennas to a digital baseband processing unit.

Example 11 includes the method of example 8 further including matching the analog signals to fixed bit ADCs such that higher gain signals are matched to ADCs with a higher number of quantization bits.

Example 12 includes the method of example 1 and further comprising determining channel gain for the analog signals, and assigning quantization bits to ADCs as a function of the determined channel gains such that ADCs receiving higher gain signals are assigned a higher number of quantization bits.

In example 13, a base station comprises an array of beamforming antennas that receive signals with varying signal-to-noise, a plurality of analog-to-digital converters (ADCs) having different numbers of quantization bits, and wherein the ADCs are coupled to the antennas such that error vector magnitude of the signals is minimized for a fixed total number of quantization bits of the base station.

Example 14 includes the base station of example 13 wherein the array of antennas comprises an array of N millimeter (MM) wave beamforming antennas and wherein the plurality of ADCs comprises N ADCs, and wherein the number of quantization bits are assigned to ADCs as a function of received signal gains.

Example 15 includes the base station of example 13 wherein bit allocation to ADCs is a function of a mean square quantization error (MSQE) minimization algorithm.

Example 16 includes the base station of example 15 wherein a greedy bit allocation algorithm is performed to increase quantization bits for the largest MSQE until a total number available bits is used and wherein a fixed number of quantization bits for each ADC is derived as a function of an average of multiple greedy bit allocation algorithm performances over time for each ADC for a given communication environment.

Example 17 includes the base station of example 13 and further comprises a dynamic switch coupled between the array of antennas and the ADCs to dynamically couple the ADCs to the antennas and an RF combiner coupled between the array of antennas and the ADCs to combine the signals comprising real and imaginary components of the signals from the antennas, such that the dynamic switch provides the components to corresponding pairs of ADCs.

Example 18 includes the base station of example 13 and wherein a number of bits of an ADC of the plurality of ADCs is variable and the total number of quantization bits available to the base station is a fixed number, and wherein quantization bits are assigned to ADCs as a function of received signal gain such that some ADCs have different numbers of quantization bits.

Example 19 includes the base station of Example 18 and wherein each antenna is coupled to an RF channel and each RF channel is sampled using a variable bit ADC of the plurality of ADCs.

In example 20, a base station comprises a processor and a storage device coupled to the processor to cause the processor to execute operations. The operations include determining a signal-to-noise ratio for analog signals received by multiple antennas in an array of antennas of a base station, providing the analog signals to a plurality of analog-to-digital converters (ADCs) of the base station having different numbers of quantization bits allocated from a fixed total number of available quantization bits of the base station, wherein the quantization bits are allocated to the ADCs such that error vector magnitude of the analog signals is reduced, and converting the analog signals to digital signals via the ADCs.

Example 21 includes the base station of example 20 wherein the operations further include determining signal gains for each antenna and assigning quantization bits to ADCs as a function of the determined signal gains.

Example 22 includes the base station of example 20 wherein a mean square quantization error (MSQE) minimization problem is solved to find optimal bit allocation for the ADCs.

Example 23 includes the base station of example 22 wherein a greedy bit allocation algorithm is performed to increase quantization bits for the largest MSQE until a total number available bits is used.

Example 24 includes the base station of example 23 wherein a fixed number of quantization bits for each ADC is derived as a function of an average of multiple greedy bit allocation algorithm performances over time for that ADC for a given communication environment.

Example 25 includes the base station of claim 20 wherein the plurality of ADCs include variable bit ADCs and a number of quantization bits assigned to each ADC is derived as a function of a greedy bit allocation algorithm until the total number of available quantization bits are assigned.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A method performed by a base station, the method comprising:
   receiving radio frequency (RF) signals at each of a plurality of antennas in an antenna array and producing an analog signal for each of the received RF signals;
   producing a digital signal for each of the analog signals by applying each of the analog signals to an analog-to-digital converter (ADC) of a plurality of ADCs of the base station;
   determining, by the base station, an error vector magnitude for each of the digital signals;
   assigning, by the base station, quantization bits to each ADC of the plurality of ADCs of the base station to reduce the error vector magnitude determined by the base station such that some ADCs have different numbers of quantization bits allocated from a fixed total number of available quantization bits for the ADCs of the base station, wherein bit allocation to the ADCs is a function of a mean square quantization error (MSQE) minimization algorithm that determines a minimized total MSQE for the array of beam forming antennas; and applying the analog signals to the ADCs with quantization bits assigned.

2. The method of claim 1 wherein the array of antennas comprise an array of N millimeter wave (mmWave) beamforming antennas and wherein the ADCs comprise N ADCs, wherein N is a positive integer.

3. The method of claim 1 and further comprising:
determining channel gain for the analog signals; and
assigning quantization bits to ADCs as a function of the determined channel gains such that higher gain signals are provided to ADCs having a higher number of quantization bits.

4. The method of claim 3 wherein the channel gain corresponds to channel state information.

5. The method of claim 1 wherein a greedy bit allocation algorithm is performed to increase quantization bits for the largest MSQE until a total number available bits is used.

6. The method of claim 5 wherein a fixed number of quantization bits for each ADC is derived as a function of an average of multiple greedy bit allocation algorithm performances over time for that ADC for a given communication environment.

7. The method of claim 1 wherein a dynamic switch is used to dynamically couple the analog signals to the ADCs to reduce the error vector magnitude.

8. The method of claim 7 wherein an RF combiner is used to combine the signals comprising real and imaginary components of the signals from the antennas, such that the dynamic switch provides the components to corresponding pairs of ADCs.

9. The method of claim 8 wherein the corresponding pairs of ADCs provide digital signals representative of the real and imaginary components of the signals from the antennas to a digital baseband processing unit.

10. The method of claim 7, including matching the analog signals to fixed bit ADCs such that higher gain signals are matched to ADCs with a higher number of quantization bits.

11. The method of claim 1 and further comprising:
determining channel gain for the analog signals; and
assigning quantization bits to ADCs as a function of the determined channel gains such that ADCs receiving higher gain signals are assigned a higher number of quantization bits.

12. A base station comprising:
an array of beamforming antennas that receive radio frequency (RF) signals with varying signal-to-noise ratio and produce analog signals;
a plurality of analog-to-digital converters (ADCs) having different numbers of quantization bits that convert the analog signals to digital signals;
a digital baseband processing unit configured to perform a training process to couple the ADCs having different numbers of quantization bits to different antennas according to signal-to-noise ratio of antenna signals, wherein bit allocation to the ADCs is a function of a mean square quantization error (MSQE) minimization algorithm that determines a minimized total MSQE for the array of beam forming antennas;
wherein the ADCs are coupled to the antennas as determined by the digital baseband processing unit such that error vector magnitude of the signals is reduced for a fixed total number of quantization bits of the base station.

13. The base station of claim 12 wherein the array of antennas comprises an array of N millimeter wave (mmWave) beamforming antennas and wherein the plurality of ADCs comprises N ADCs, and wherein the number of quantization bits are assigned to ADCs as a function of received signal gains, and N is a positive integer.

14. The base station of claim 12 wherein the digital baseband processing unit performs a greedy bit allocation algorithm to increase quantization bits for the largest MSQE until a total number available bits is used and wherein each ADC has a fixed number of quantization bits derived as a function of an average of multiple greedy bit allocation algorithm performances over time for each ADC for a given communication environment.

15. The base station of claim 12 and further comprising:
a dynamic switch coupled between the array of antennas and the ADCs to dynamically couple the ADCs to the antennas; and
an RF combiner coupled between the array of antennas and the ADCs to combine the signals comprising real and imaginary components of the signals from the antennas, such that the dynamic switch provides the components to corresponding pairs of ADCs.

16. The base station of claim 12, wherein a number of bits of an ADC of the plurality of ADCs is variable and the total number of quantization bits available to the base station is a fixed number, and wherein quantization bits are assigned to ADCs as a function of received signal gain such that some ADCs have different numbers of quantization bits.

17. The base station of claim 16, wherein each antenna is coupled to an RF channel and each RF channel is sampled using a variable bit ADC of the plurality of ADCs.

18. A base station comprising:
a processor;
a storage device coupled to the processor to cause the processor to execute operations, the operations comprising:
determining a signal-to-noise ratio for analog signals received by multiple antennas in an array of antennas of a base station;
providing each of the analog signals to an analog-to-digital converters (ADC) of a plurality of ADCs of the base station;
allocating different numbers of quantization bits to the ADCs, from a fixed total number of available ADC quantization bits of the base station, according to a total mean square quantization error (MSQE) minimization algorithm to minimize a total MSQE for the multiple antennas in the array of antennas and reduce error vector magnitude of the analog signals; and
converting the analog signals to digital signals via the ADCs with allocated quantization bits.

19. The base station of claim 18 wherein the operations further comprise:
determining signal gains for each antenna; and
assigning quantization bits to ADCs as a function of the determined signal gains.

20. The base station of claim 18 wherein a greedy bit allocation algorithm is performed to increase quantization bits for the largest MSQE until the fixed total number of available quantization bits is used.

21. The base station of claim 20 wherein a fixed number of quantization bits for each ADC is derived as a function of an average of multiple greedy bit allocation algorithm performances over time for that ADC for a given communication environment.

22. The base station of claim 18 wherein the plurality of ADCs include variable bit ADCs and a number of quantization bits assigned to each ADC is derived as a function of a greedy bit allocation algorithm until the total number of available quantization bits are assigned.

\* \* \* \* \*